(12) United States Patent
Kubota et al.

(10) Patent No.: US 8,570,041 B2
(45) Date of Patent: Oct. 29, 2013

(54) MAGNETIC RESONANCE IMAGING APPARATUS

(75) Inventors: Takeshi Kubota, Tokyo (JP); Mitsuhiro Bekku, Tokyo (JP); Osamu Takayama, Tokyo (JP); Miho Nagasawa, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 417 days.

(21) Appl. No.: 12/950,608

(22) Filed: Nov. 19, 2010

(65) Prior Publication Data

US 2011/0121831 A1    May 26, 2011

(30) Foreign Application Priority Data

Nov. 20, 2009    (JP) .................................. 2009-264851

(51) Int. Cl.
*G01R 33/44* (2006.01)
*G01R 33/483* (2006.01)

(52) U.S. Cl.
USPC ............ 324/318; 324/307; 324/309; 324/322

(58) Field of Classification Search
USPC .......................... 324/300–322; 600/407–464
See application file for complete search history.

(56) References Cited

U.S. PATENT DOCUMENTS

| 6,289,232 | B1 | 9/2001 | Jakob et al. | |
|---|---|---|---|---|
| 6,483,308 | B1 | 11/2002 | Ma et al. | |
| 6,559,642 | B2 * | 5/2003 | King | 324/307 |
| 7,064,547 | B1 | 6/2006 | King et al. | |
| 7,224,163 | B2 | 5/2007 | Takizawa et al. | |
| 2003/0132750 | A1 * | 7/2003 | Machida et al. | 324/322 |
| 2008/0197844 | A1 * | 8/2008 | Ying et al. | 324/309 |
| 2010/0253339 | A1 * | 10/2010 | Gross | 324/309 |
| 2013/0113486 | A1 * | 5/2013 | Imamura et al. | 324/322 |

FOREIGN PATENT DOCUMENTS

JP    2008-099974    5/2008

* cited by examiner

*Primary Examiner* — Jermele M Hollington
*Assistant Examiner* — Emily Chan
(74) *Attorney, Agent, or Firm* — Armstrong Teasdale LLP

(57) ABSTRACT

A magnetic resonance imaging apparatus executes a calibration scan for acquiring calibration data used to correct image data of a subject and an imaging scan for acquiring the image data of the subject and receives magnetic resonance signals using combinations of coil elements selected out of a plurality of coil elements. The magnetic resonance imaging apparatus includes a calibration scan condition determining device for determining a scan condition for the calibration scan, based on a first scan range of the subject taken when the imaging scan is executed and a first combination of coil elements used to receive magnetic resonance signals in the first scan range.

12 Claims, 22 Drawing Sheets

FIG. 2

COMBINATIONS OF COIL ELEMENTS

Set 1 = 4 a + 4 b
Set 2 =           4 c + 4 d
Set 3 =                   4 e + 4 f
Set 4 =                             4 g + 4 h
Set 5 = 4 a + 4 b + 4 c + 4 d
Set 6 =           4 c + 4 d + 4 e + 4 f
Set 7 =                   4 e + 4 f + 4 g + 4 h
Set 8 = 4 a + 4 b + 4 c + 4 d + 4 e + 4 f
Set 9 =           4 c + 4 d + 4 e + 4 f + 4 g + 4 h
Set 10 = 4 a + 4 b + 4 c + 4 d + 4 e + 4 f + 4 g + 4 h

| | SCAN CONDITION FOR CALIBRATION SCAN Scal1 (REFER TO FIG. 11) | SCAN CONDITION FOR IMAGING SCAN IS2 (REFER TO FIG. 12) |
|---|---|---|
| COMBINATION OF COIL ELEMENTS | Set8 | Set10 |
| ORIENTATION AND POSTURE OF SUBJECT | | |
| SCAN RANGE | V1 | SR2 |

| | SCAN CONDITION FOR CALIBRATION SCAN Scal1 (REFER TO FIG. 11) | SCAN CONDITION FOR CALIBRATION SCAN Scal2 (REFER TO FIG. 15) | SCAN CONDITION FOR IMAGING SCAN IS3 (REFER TO FIG. 16) |
|---|---|---|---|
| COMBINATION OF COIL ELEMENTS | Set8 | Set10 | Set8 |
| ORIENTATION AND POSTURE OF SUBJECT | | | |
| SCAN RANGE | V1 | V2 | SR3 |

FIG. 19

COMBINATIONS OF COIL ELEMENTS

Set 21 = 2 0 a + 2 0 b
Set 22 =           2 0 c + 2 0 d
Set 23 = 2 0 a + 2 0 b + 2 0 c + 2 0 d

MAGNETIC RESONANCE IMAGING APPARATUS

CROSS REFERENCE TO RELATED APPLICATIONS

This application claims the benefit of Japanese Patent Application No. 2009-264851 filed Nov. 20, 2009, which is hereby incorporated by reference in its entirety.

BACKGROUND OF THE INVENTION

The present invention relates to a magnetic resonance imaging apparatus which performs a calibration scan and an imaging scan.

As a method for imaging a subject using a magnetic resonance imaging apparatus, there have been known ASSET (Array Spatial Sensitivity Encoding Technique) corresponding to one parallel imaging method and PURE (Phased array UnifoRmity Enhancement) corresponding to one sensitivity correction technology (refer to Japanese Unexamined Patent Publication No. 2008-099974).

When imaging is performed by ASSET or PURE, it is necessary to prepare calibration data for correcting image data acquired by an actual scan. Generally, the calibration data can be obtained by performing a calibration scan for acquiring calibration data each time the imaging is executed by ASSET or PURE. This method is however accompanied by a problem that each time the imaging is performed by ASSET or PURE, an operator needs to set a condition for performing a calibration scan, and hence a burden is placed on the operator.

It is desirable that the problem described previously is solved.

BRIEF DESCRIPTION OF THE INVENTION

A first aspect of the invention is a magnetic resonance imaging apparatus which executes a calibration scan for acquiring calibration data used to correct image data of a subject and an imaging scan for acquiring the image data of the subject and receives magnetic resonance signals using combinations of coil elements selected out of a plurality of coil elements, including: calibration scan condition determining device for determining a scan condition for the calibration scan, based on a first scan range of the subject taken when the imaging scan is executed and a first combination of coil elements used to receive magnetic resonance signals in the first scan range.

In some embodiments, a condition for a calibration scan is determined based on a first scan range at an imaging scan and a first combination of coil elements. Accordingly, an operator needs not to manually set the condition for the calibration scan, and hence a burden on the operator is lightened.

Further aspects of the present invention will be apparent from the following description of the preferred embodiments of the invention as illustrated in the accompanying drawings.

BRIEF DESCRIPTION OF THE DRAWINGS

FIG. 2 is a diagram for describing combinations of selectable coil elements.

FIG. 19 is a diagram for explaining combinations of selectable coil elements.

DETAILED DESCRIPTION OF THE INVENTION

(1) First Embodiment

Figure 1:
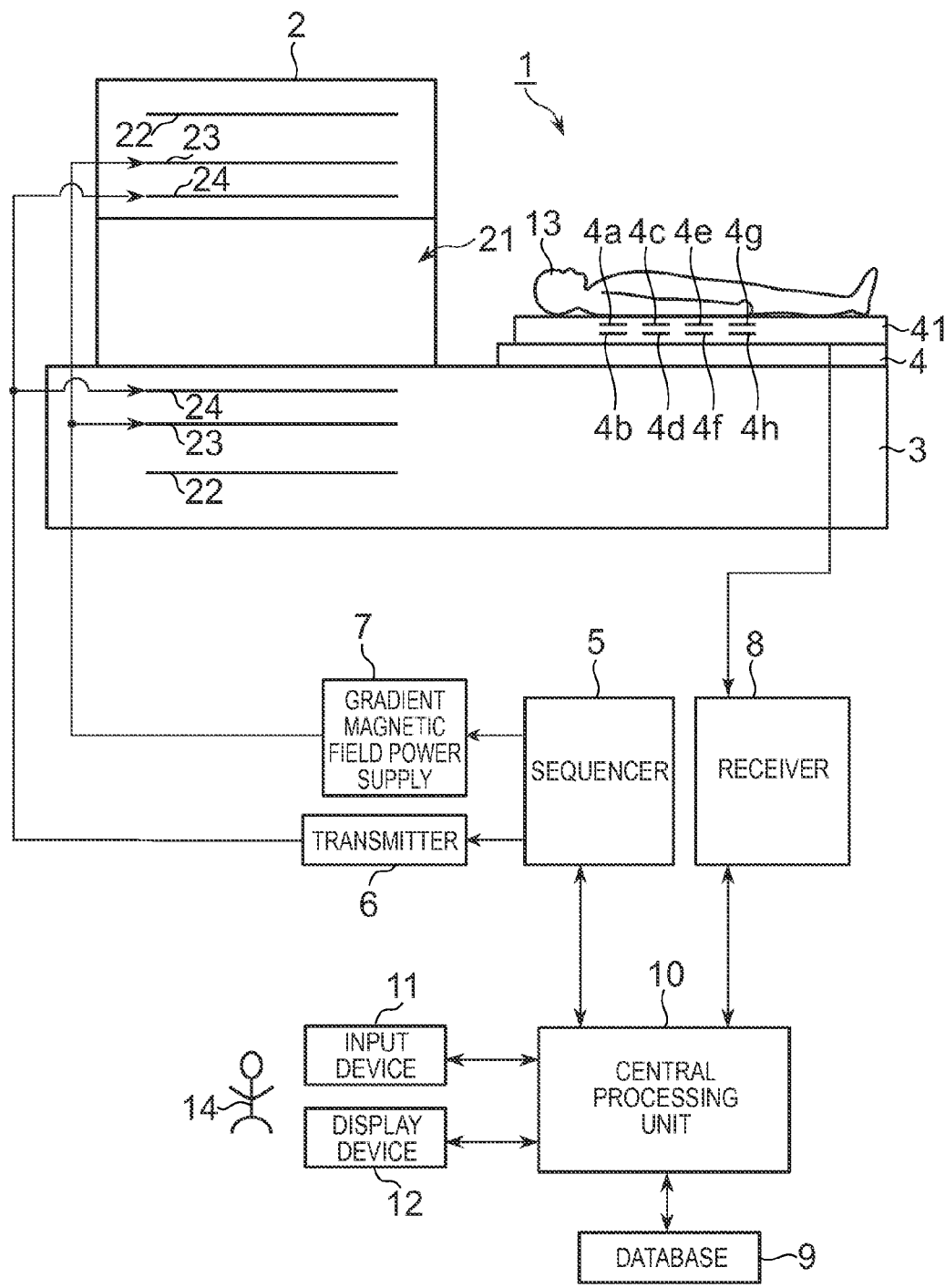
FIG. 1 shows a magnetic resonance imaging apparatus according to a first embodiment of the invention.

FIG. 1 is a magnetic resonance imaging apparatus according to a first embodiment of the invention.

The magnetic resonance imaging apparatus (hereinafter called "MRI (Magnetic Resonance Imaging) apparatus") 1 has a magnetic field generator 2, a table 3, a cradle 4, a coil device 41, etc.

The magnetic field generator 2 has a bore 21 in which a subject 13 is accommodated, a superconductive coil 22, a gradient coil 23 and an RF coil 24. The superconductive coil 22 generates a static magnetic field B0 and the gradient coil 23 applies a gradient magnetic field. Further, the RF coil 24 transmits an RF pulse and receives each magnetic resonance signal of the subject 13 as needed.

The table 3 is provided with the cradle 4 with the subject 13 placed thereon. The cradle 4 is moved into the bore 21 to thereby convey the subject 13 within the bore 21.

The coil device 41 has a plurality of coil elements 4a through 4h for receiving the magnetic resonance signals of the subject 13. The coil device 41 is placed in a position determined in advance with respect to the cradle 4.

The MRI apparatus 1 further has a sequencer 5, a transmitter 6, a gradient magnetic field power supply 7, a receiver 8, a database 9, a central processing unit 10, an input device 11 and a display device 12.

Under the control of the central processing unit 10, the sequencer 5 transmits information (center frequency, bandwidth and the like) about an RF pulse and sends information (strength of gradient magnetic field, etc.) about a gradient magnetic field to the gradient magnetic field power supply 7.

The transmitter 6 drives the RF coil 24, based on the information transmitted from the sequencer 5.

The gradient magnetic field power supply 7 drives the gradient coil 23, based on the information sent from the sequencer 5.

The receiver 8 signal-processes each magnetic resonance signal received by the coil device 41 and transmits it to the central processing unit 10.

The database 9 stores therein sensitive regions (refer to FIGS. 3(a) through 5(b)) to be described later.

The central processing unit 10 controls the operations of respective parts of the MRI apparatus 1 so as to implement various operations of the MRI apparatus 1 such as reconstruction of an image based on each signal received from the receiver 8, etc. Further, the central processing unit 10 determines whether a calibration scan (refer to Step S5 of FIG. 6 to be described later) to be described later should be executed. When it is determined that the calibration scan is executed, the central processing unit 10 decides a scan range at the calibration scan and further selects a combination of coil elements used to receive magnetic resonance signals in the scan range. The central processing unit 10 includes, for example, a computer. Incidentally, the central processing unit 10 is one example of a calibration scan condition determining device in the invention and functions as this device by executing a predetermined program.

The input device 11 inputs various instructions to the central processing unit 10 according to the operations of an operator 14. The display device 12 displays various information thereon.

The MRI apparatus 1 is configured as described above.

The coil elements 4a through 4h of the coil device 41 will next be described. In the first embodiment, when the magnetic resonance signals of the subject 13 are received, the combinations of the coil elements suited to receiving the magnetic resonance signals of the subject 13 are selected out of the eight coil elements 4a through 4h. However, the combinations of the coil elements selectable out of the eight coil elements 4a through 4h have been determined in advance. The combinations of the selectable coil elements will be explained below.

FIG. 2 is a diagram for describing the combinations of the selectable coil elements.

In the first embodiment, ten combinations Set1 through Set10 are prepared as the combinations of the selectable coil elements. For instance, the combination Set1 of the coil elements includes the two coil elements 4a and 4b.

FIGS. 3A-3D, 4A-4D, 5A and 5B are respectively diagrams for explaining sensitive regions of the combinations Set1 through Set10 of the coil elements.

Figure 3A:
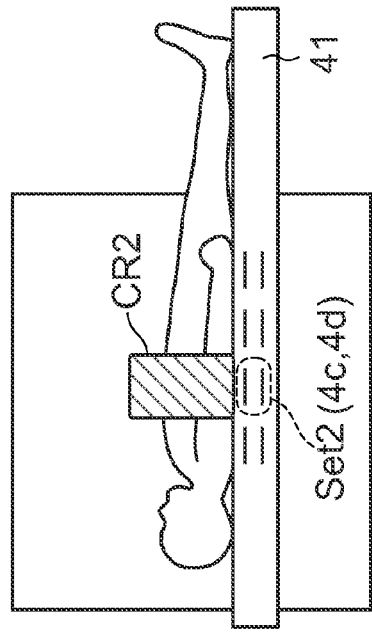
FIG. 3A through FIG. 3D are diagrams for describing sensitive regions of the combinations Set1 through Set4 of the coil elements.
Figure 3B:
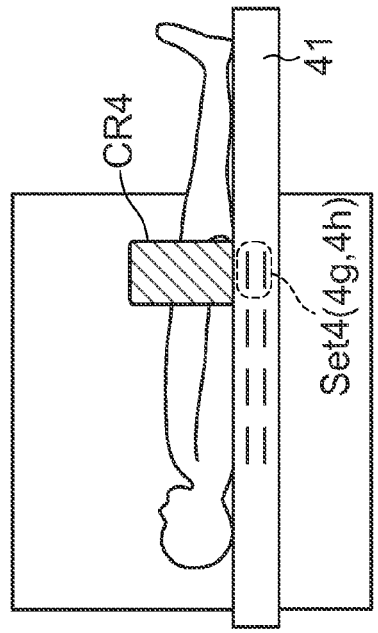
Figure 3C:
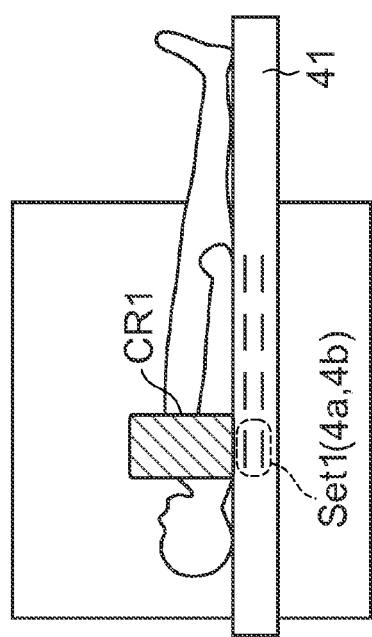
Figure 3D:
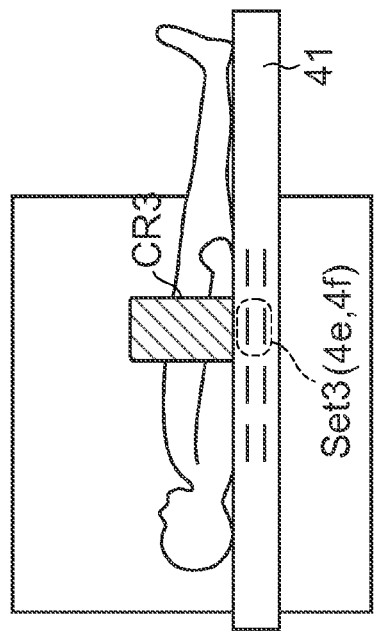
Figure 4A:
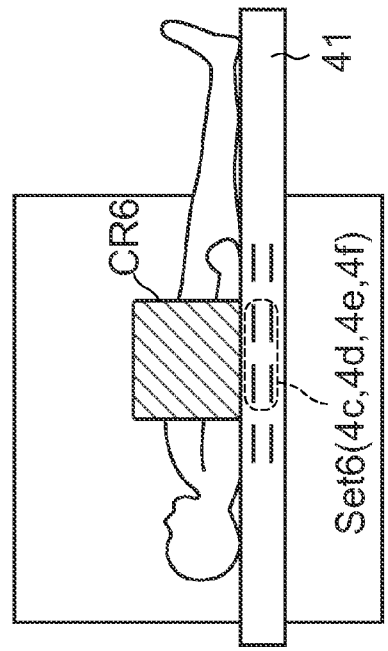
FIG. 4A through FIG. 4D are diagrams for describing sensitive regions of the combinations Set5 through Set8 of the coil elements.
Figure 4B:
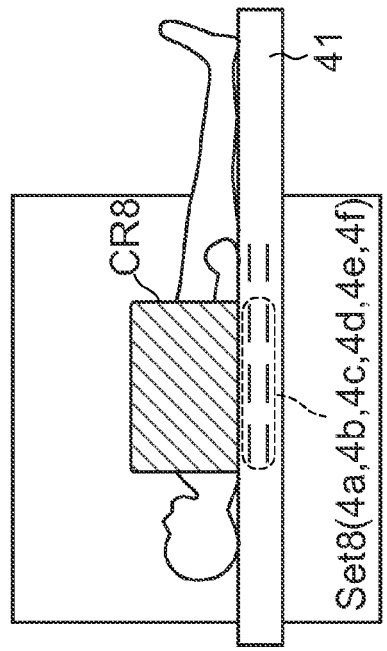
Figure 4C:
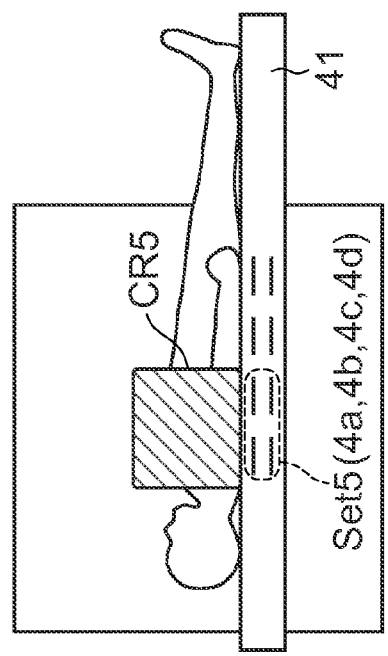
Figure 4D:
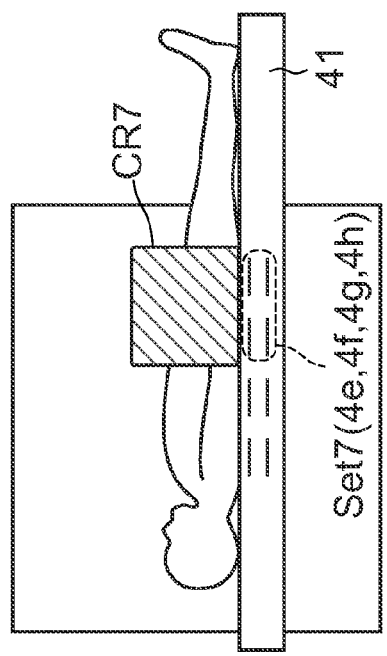
Figure 5A:
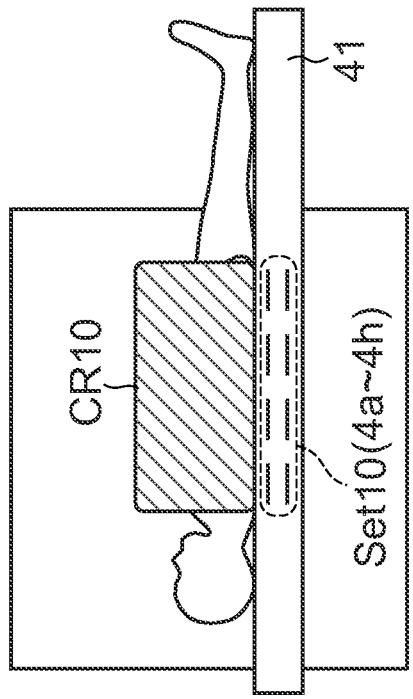
FIG. 5A and FIG. 5B are diagrams for describing sensitive regions of the combinations Set9 and Set10 of the coil elements.
Figure 5B:
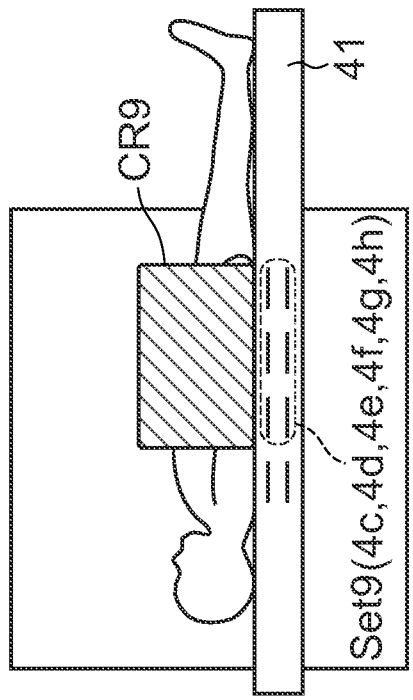

For instance, the sensitive region CR1 of the combination Set1 is shown in FIG. 3A. The sensitive region CR1 is of a region considered to have sensitivity enough for the combination Set1 to acquire a high-quality MR image. The range of the sensitive region CR1 is determined based on the sensitivity characteristic of the combination Set1, which has been examined in advance. Information about the position of the sensitive region CR1 relative to the cradle 4 has been stored in the database 9.

While the sensitive region CR1 of the combination Set1 has been explained in the above description, information about the positions of the sensitive regions CR2 through CR10 of other combinations Se2 through Set10 have also been stored in the database 9.

The sensitive regions CR1 through CR10 of the combinations Set1 through Set10 have been defined as described above.

A flow used when the subject 13 is imaged will next be explained.

Figure 6:
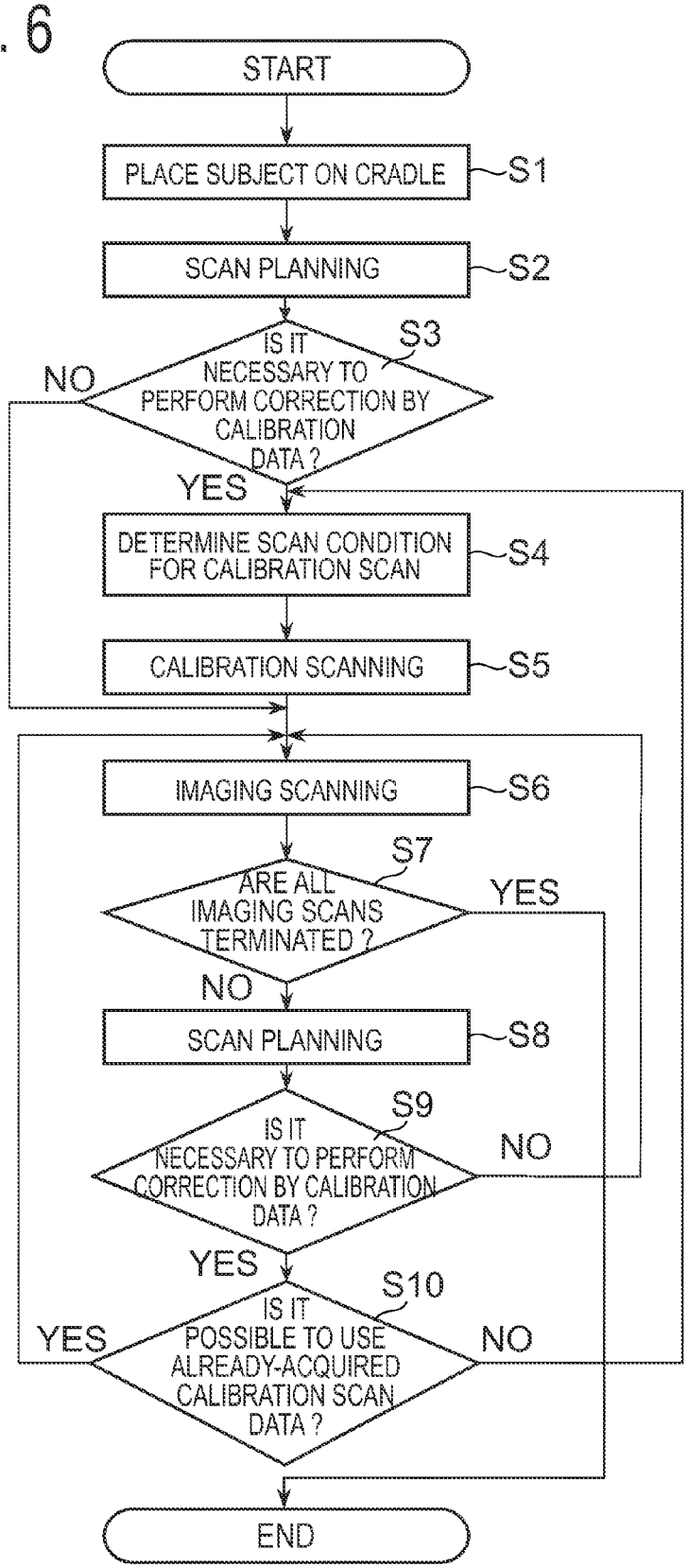
FIG. 6 is a diagram showing a processing flow of the MRI apparatus 1 when a subject 13 is imaged.

FIG. 6 is a diagram showing a processing flow of the MRI apparatus 1 when the subject 13 is imaged. Incidentally, when describing FIG. 6, it will be explained referring to FIGS. 7 through 17 as needed.

Figure 7:
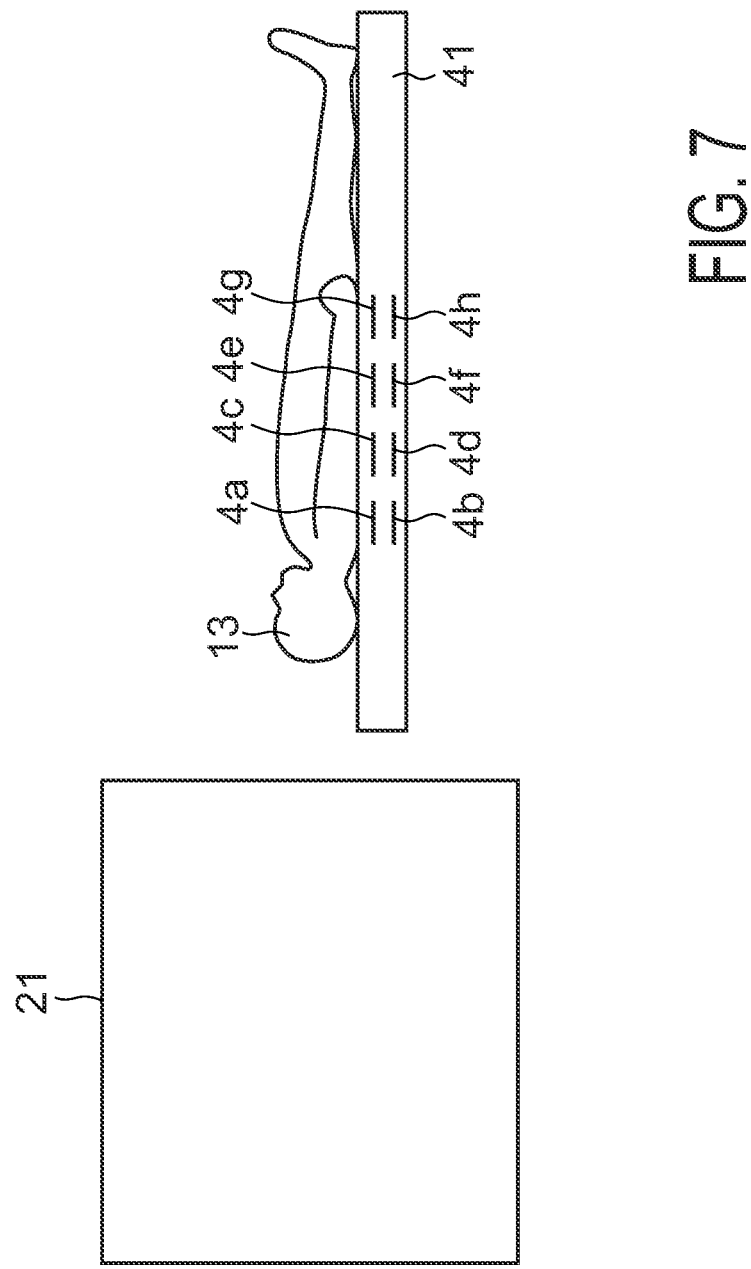
FIG. 7 is a diagram illustrating the manner in which the subject 13 is placed on a cradle.

At Step S1, the subject 13 is placed on the cradle (refer to FIG. 7).

FIG. 7 is a diagram showing the manner in which the subject 13 is placed on the cradle.

After the subject 13 has been placed thereon, the subject 13 is conveyed within the bore. After the subject 13 has been conveyed within the bore, the processing flow proceeds to Step S2.

Figure 8:
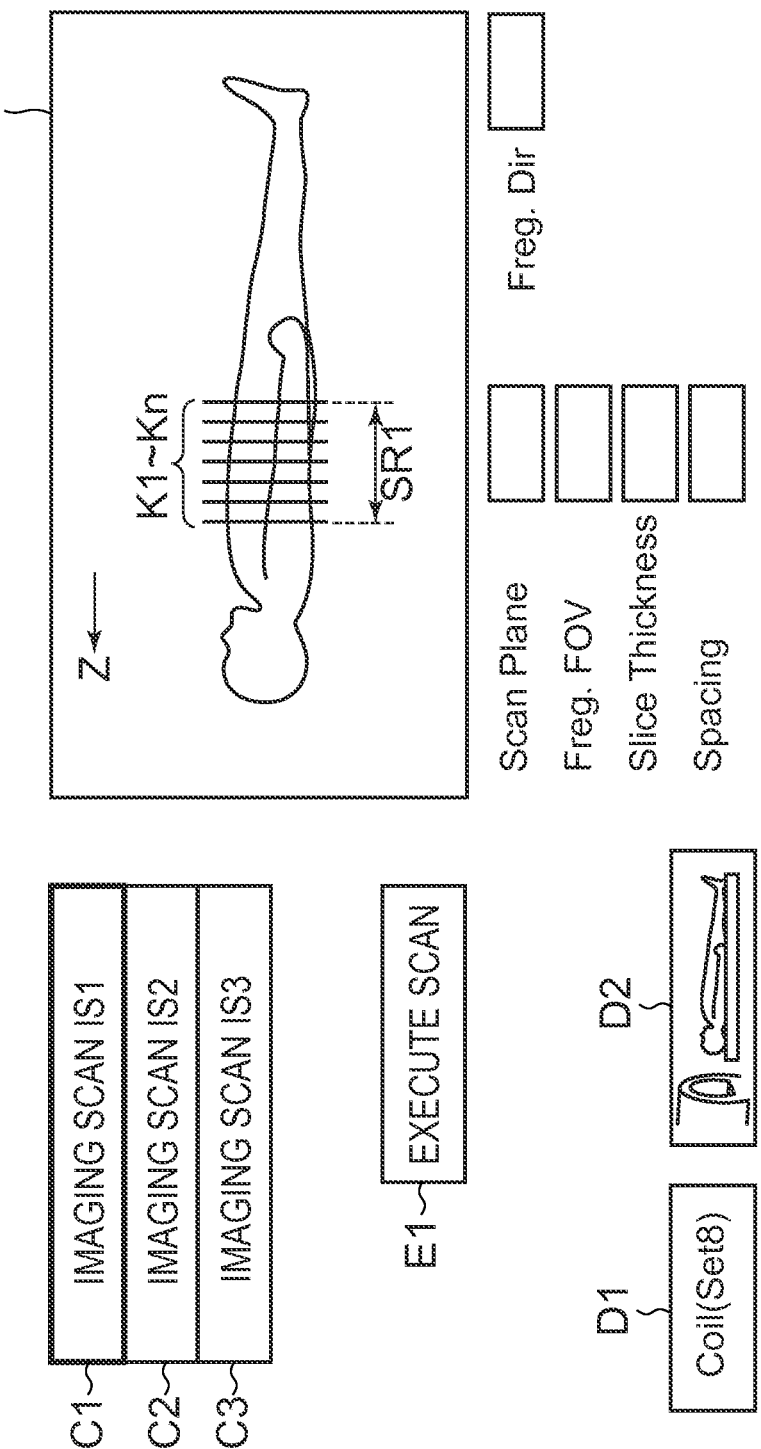
FIG. 8 is a diagram depicting one example of a display screen when a scan plan is developed.
Figure 9A:
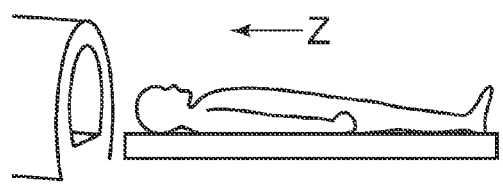
FIG. 9A through FIG. 9H are diagrams showing patterns of orientations and postures of the subject 13, each of which is represented in an orientation/posture set button D2.
Figure 9E:
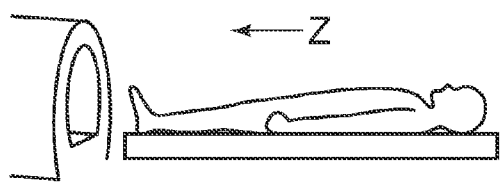
Figure 9B:
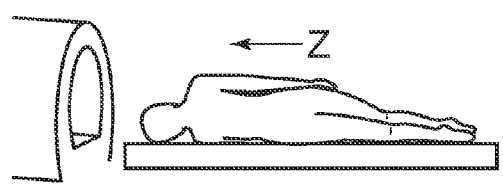
Figure 9F:
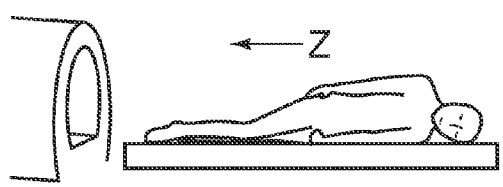
Figure 9C:
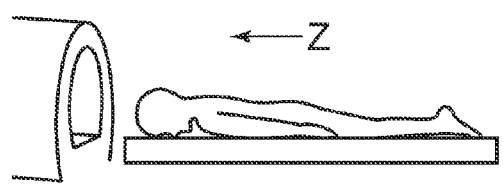
Figure 9G:
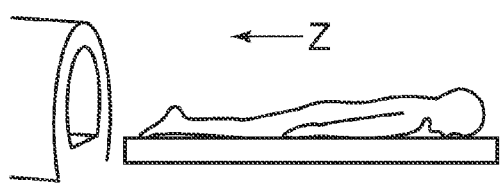
Figure 9D:
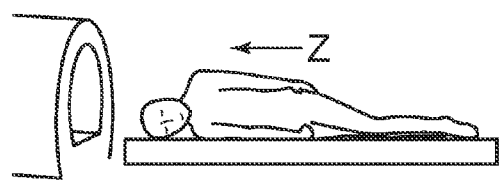
Figure 9H:
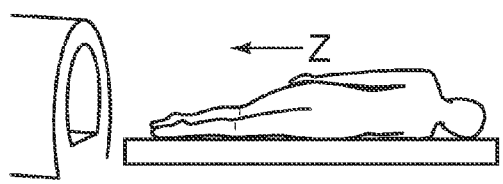

At Step S2, the operator 14 develops a scan plan when the subject 13 is scanned (refer to FIG. 8).

FIG. 8 is a diagram showing one example of a display screen at the time that a scan plan is drawn out.

The names of imaging scans executed to acquire image data of the subject 13 are displayed in the upper left columns C1 through C3 of the display screen. In FIG. 8, the names of the imaging scans displayed in the columns C1 through C3 are respectively taken as "imaging scan IS1", "imaging scan IS2" and "imaging scan IS3" for convenience of explanation. These imaging scans IS1 through IS3 are different in the conditions such as an imaging section and the like, but are scans all carried out by a parallel imaging method.

The operator 14 first sets a scan condition for the imaging scan IS1. When the scan condition for the imaging scan IS1 is set, the operator 14 clicks the column C1. When the column C1 is clicked, a condition input screen for inputting the scan condition related to the imaging scan IS1 is displayed in the upper right and lower part of the display screen. A positioning image IM for performing the positioning of each slice is displayed in the upper right of the display screen. A coil element selection button D1 for selecting coil elements used in the imaging scan IS1, an orientation/posture set button D2 for inputting the orientation and posture of the subject 13, etc. are displayed in the lower part of the display screen.

The operator 14 operates the input device 11 (refer to FIG. 1) while referring to the positioning image IM to thereby input each slice to the positioning image IM. FIG. 8 shows the manner in which slices K1 though Kn are inputted to the positioning image IM. In the first embodiment, the slices K1 through Kn are axial sections but may be other sections. A range surrounded by the slices K1 through Kn becomes a scan range SR1 at the imaging scan IS1.

After the slices K1 through Kn have been set, the operator 14 selects the corresponding combination of coil elements suited to receiving magnetic resonance signals of the slices K1 through Kn out of the coil elements 4a through 4h (refer to FIG. 1). In the first embodiment, as shown in FIGS. 2, 3A-3D, and 4A-4D, the combinations of the selectable coil elements have been determined in advance (combinations Set1 through Set10 of coil elements). Thus, the operator 14 selects the corresponding combination of coil elements suited to receiving the magnetic resonance signals of the slices K1 through Kn out of the combinations Set1 through Set10 of the coil elements. Now, assume that when the imaging scan IS1 is executed, the operator 14 has judged that the combination Set8 of the coil elements is most suitable within the combinations Set1 through Set10. Thus, the operator 14 clicks the coil element selection button D1 (refer to FIG. 8) and thereby selects the combination Set8 of the coil elements out of the combinations Set1 through Set10. Incidentally, the combination of the coil elements may be selected automatically.

The operator 14 operates the orientation/posture set button D2 to input the orientation and posture of the subject 13 taken when the subject 13 is placed on the cradle. The orientation and posture of the subject 13 are displayed in the orientation/posture set button D2. Each time the orientation/posture set button D2 is clicked, the orientations and postures of the subject 13 corresponding to eight patterns are displayed (refer to FIG. 9A through FIG. 9H).

FIG. 9A through FIG. 9H are diagrams showing the patterns of the orientations and postures of the subject 13, each of which is displayed in the orientation/posture set button D2.

In the first embodiment, the orientations and postures of the subject 13 are divided into eight patterns (a) through (h). In the patterns (a) through (d), the orientation of the subject 13 is set in such a manner that the head thereof faces in a z direction (leg portion thereof faces in a -z direction), whereas the posture of the subject 13 assumes a face-up, a lateral orientation (left side thereof is placed down), a face-down and a lateral orientation (right side thereof is placed down). In the patterns (e) through (h), the orientation of the subject 13 is set in such a manner that the leg portion thereof faces in the z direction (head thereof faces in the –z direction), whereas the posture of the subject 13 assumes a face-up, a lateral orientation (left side is placed down), a face-down and a lateral orientation (right side is placed down). In the present embodiment, since the orientation and posture of the subject 13 belong to the pattern (a), the operator 14 causes the orientation/posture set button D2 (refer to FIG. 8) to display the orientation and posture of the subject 13 corresponding to the pattern (a). It is thus possible to input the orientation and posture of the subject 13 when the subject 13 is placed on the cradle.

Further, the operator 14 also sets other scan conditions such as a slice thickness, etc. where necessary. It is thus possible to input the scan condition for the imaging scan IS1.

After the scan condition for the imaging scan IS1 has been inputted, the operator 14 clicks a scan execution button E1 to perform the imaging scan IS1. After the scan execution button E1 has been clicked, the processing flow proceeds to Step S3.

At Step S3, the central processing unit 10 determines whether it is necessary to correct image data obtained by the imaging scan IS1 by calibration data indicative of a sensitivity distribution of each coil element. When it is determined that there is no need to correct it by the calibration data, the processing flow proceeds to Step S6, where the imaging scan IS1 is executed. On the other hand, when it is determined by the central processing unit 10 that there is a need to correct it by the calibration data, the processing flow proceeds to Step S4.

In the first embodiment, the imaging scan IS1 corresponds to the scan using the parallel imaging technique for receiving each magnetic resonance signal using the combination Set8 of the coil elements (refer to button D1 of FIG. 8). Accordingly, the image data acquired by the imaging scan IS1 needs to be corrected by calibration data indicative of respective sensitivity distributions of the six coil elements 4a through 4f (refer to FIG. 4D) contained in the combination Set8 of the coil elements. Therefore, the central processing unit 10 determines that the image data obtained by the imaging scan IS1 needs to be corrected by the calibration data, and the processing flow proceeds to Step S4.

At Step S4, the central processing unit 10 (refer to FIG. 1) decides a scan condition for a calibration scan Sca11 executed to acquire calibration data. Described concretely, it decides the combination of coil elements for receiving the magnetic resonance signals generated by execution of the calibration scan Sca11 and the scan range taken when the calibration scan Sca11 is performed. A description will be made below of how the combination of the coil elements and the scan range are determined.

(1) A method for determining the combination of the coil elements at the calibration scan Sca11:

The combination of the coil elements used in the calibration scan Sca11 should be identical to that of coil elements used in the imaging scan IS1. At the imaging scan IS1, the combination Set8 of the coil elements is used (refer to button D1 of FIG. 8). Accordingly, the central processing unit 10 determines that the magnetic resonance signals are received using the combination Set8 of the coil elements at the calibration scan Sca11.

(2) A method for determining the scan range taken when the calibration scan Sca11 is performed:

The scan range for the calibration scan Sca11 needs to include the entire scan range SR1 (refer to the positioning image IM of FIG. 8) at the imaging scan IS1, which has been set by the operator 14. Thus, the scan range for the calibration scan Sca11 is set to include the entire scan range SR1 at the imaging scan IS1, which has been set by the operator 14 (refer to FIG. 10).

Figure 10:
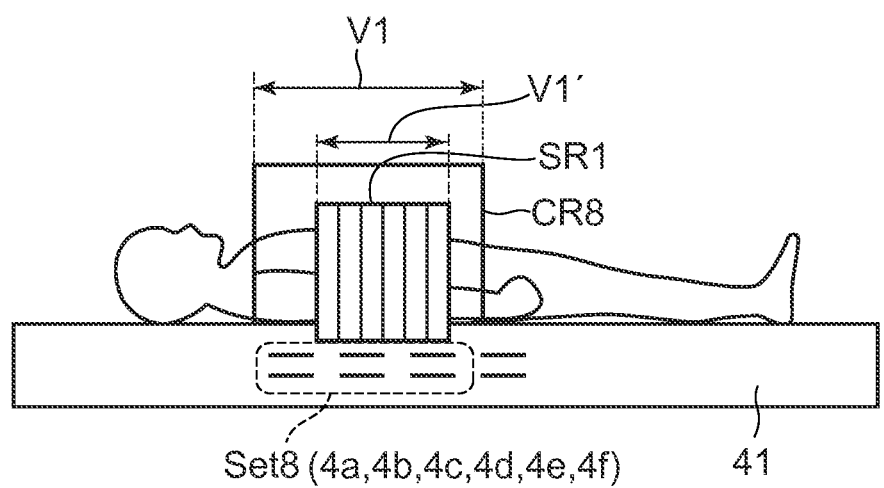
FIG. 10 is a diagram illustrating a scan range of a calibration scan Sca11.

FIG. 10 is a diagram showing the scan range for the calibration scan Sca11.

In FIG. 10, two scan ranges V1 and V1' are respectively shown as the scan range for the calibration scan Sca11. The scan range V1' is set so as to include only the scan range SR1 for the imaging scan IS1. On the other hand, the scan range V1 is set so as to include both of the scan range SR1 for the imaging scan IS1 and the sensitive region CR8 of the combination Set8 of the coil elements. Since the scan range for the calibration scan Sca11 may include the entire scan range SR1 for the imaging scan IS1, either of the scan ranges V1 and V1' may be set as the scan range for the calibration scan Sca11. In the first embodiment, the description of the scan range V1 will be continued assuming that the scan range V1 is adopted as the scan range for the calibration scan Sca11.

The combination Set8 of the coil elements at the calibration scan Sca11, and the scan range V1 are determined Other scan conditions are also determined as needed. Thereafter, the processing flow proceeds to Step S5.

At Step S5, the calibration scan Sca11 is performed in accordance with the scan condition determined at Step S4. At the calibration scan Sca11, the scan range V1 (refer to FIG. 10) is scanned. Magnetic resonance signals from the scan range V1 are received by the combination Set8 of the coil elements. The central processing unit 10 calculates calibration data CAL1 indicative of respective sensitivity distributions of the six coil elements 4a through 4f (refer to FIG. 10) configuring the combination Set8, based on the received magnetic resonance signals. The calculated calibration data CAL1 is stored in association with the following information (1) through (3):

(1) Combination Set8 of coil elements used in calibration scan Sca11, (2) Orientation and posture of subject at calibration scan Sca11 (pattern (a)), and (3) Scan range V1 at calibration scan Sca11.

Figure 11:
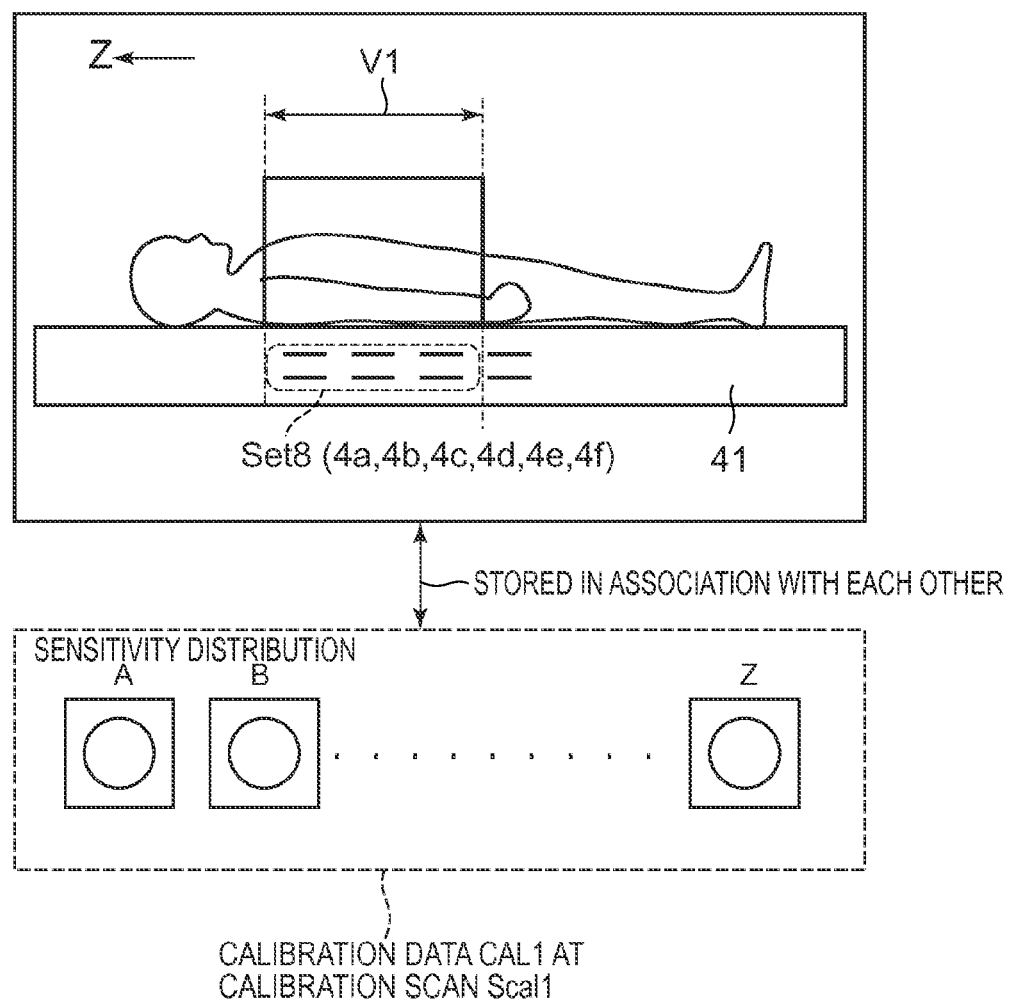
FIG. 11 is a diagram schematically showing the manner in which calibration data CAL1 and information (1) through (3) are associated with one another.

FIG. 11 schematically shows the manner in which the calibration data CAL1 and the above information (1) through (3) are associated with one another. After the calibration data CAL1 has been stored in association with the above information (1) through (3), the processing flow proceeds to Step S6.

At Step S6, the imaging scan IS1 is performed. At the imaging scan IS1, the corresponding magnetic resonance signals of the slices K1 through Kn are received using the combination Set8 of the coil elements in accordance with the condition set by the operator 14. Thereafter, image data is generated based on the received magnetic resonance signals, and the generated image data is corrected using the calibration data CAL1 (refer to FIG. 11) determined at Step S5. It is thus possible to acquire a high-quality MR image. After the execution of the imaging scan IS1, the processing flow proceeds to Step S7.

At Step S7, it is determined whether all imaging scans are executed. When it is determined that all the imaging scans have been executed, the processing flow is terminated. On the other hand, when it is determined that all the imaging scans have not yet been executed, the processing flow proceeds to Step S8.

In the first embodiment, there is a need to perform the three imaging scans IS1 through IS3 (refer to FIG. 8). The imaging scan IS1 has been executed, but other two imaging scans IS2 and IS3 have not yet been executed. Accordingly, the processing flow proceeds to Step S8.

At Step S8, the operator 14 develops a scan plan at the imaging scan IS2.

Figure 12:
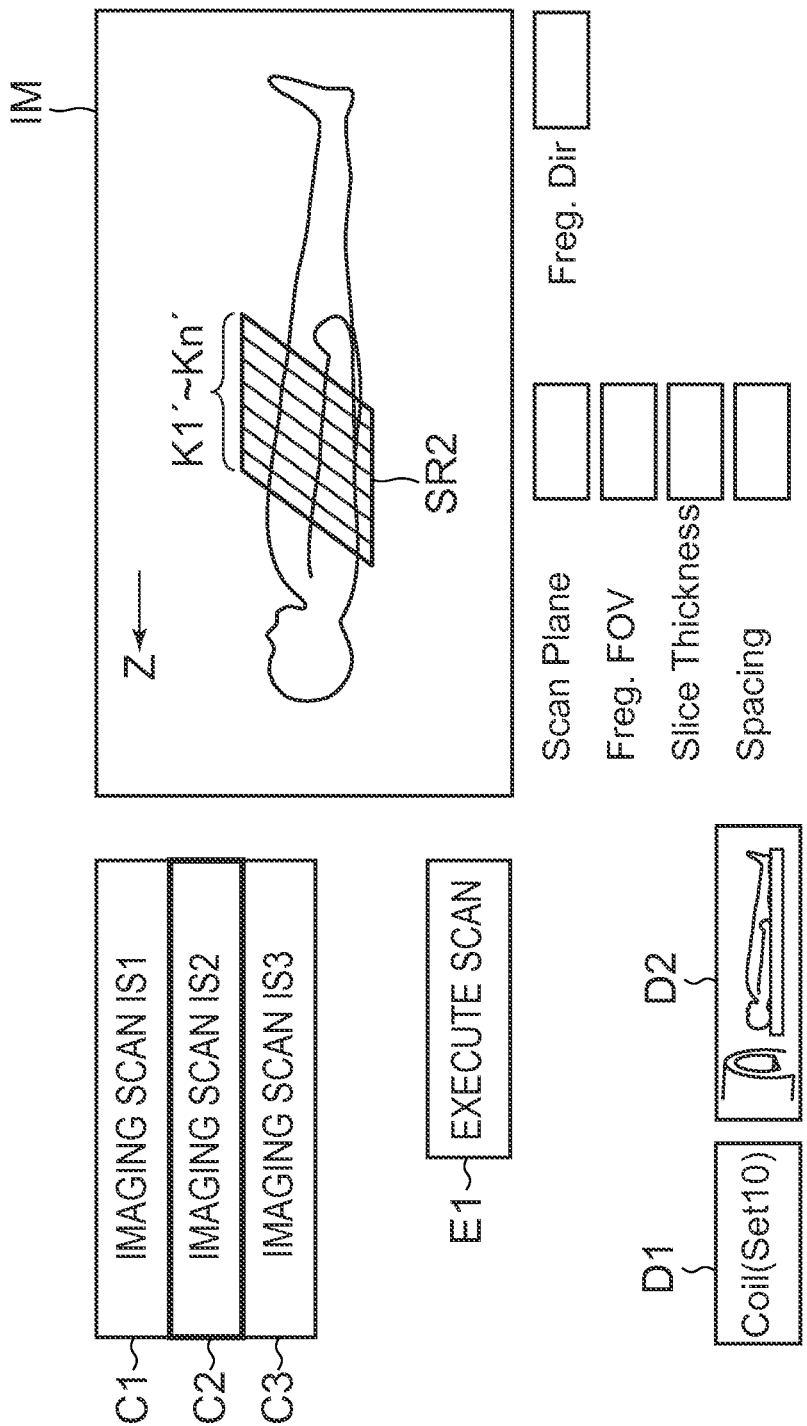
FIG. 12 is a diagram depicting one example of a display screen when a scan plan at an imaging scan IS2 is developed.

FIG. 12 is a diagram showing one example of a display screen when the scan plan at the imaging scan IS12 is developed.

The operator 14 operates the input device 11 (refer to FIG. 1) while referring to the positioning image IM and thereby inputs slices to the positioning image IM. The manner in which slices K1' through Kn' are inputted to the positioning image IM is shown in FIG. 12. In the first embodiment, the slices K1' through Kn' are oblique sections but may be other sections. A range surrounded by the slices K1' through Kn' becomes a scan range SR2 at the imaging scan IS2.

After the slices K1' through Kn' have been set, the operator 14 selects the corresponding combination of coil elements suited to receiving magnetic resonance signals of the slices K1' through Kn' out of the coil elements 4a through 4h (refer to FIG. 1). In the first embodiment, as shown in FIGS. 2, 3A-3D, 4A-4D, 5A and 5B, the combinations of the selectable coil elements have been determined in advance (combinations Set1 through Set10 of coil elements). Thus, the operator 14 selects the corresponding combination of coil elements suited to receiving the magnetic resonance signals of the slices K1' through Kn' out of the combinations Set1 through Set10 of the coil elements. Now, assume that when the imaging scan IS2 is executed, the operator 14 has judged that the combination Set10 of the coil elements is most suitable within the combinations Set1 through Set10. Thus, the operator 14 clicks the coil element selection button D1 and thereby selects the combination Set10 of the coil elements out of the combinations Set1 through Set10.

The operator 14 operates the orientation/posture set button D2 to input the orientation and posture of the subject 13 when the subject 13 is placed on the cradle. In the first embodiment, since the orientation and posture of the subject 13 are given as the pattern (a), the operator 14 causes the orientation/posture set button D2 to display the orientation and posture of the subject 13 corresponding to the pattern (a). It is thus possible to input the orientation and posture of the subject 13 when the subject 13 is placed on the cradle.

Further, the operator 14 also sets other scan conditions such as a slice thickness, etc. where necessary. It is thus possible to input the scan condition for the imaging scan IS2.

After the scan condition for the imaging scan IS2 has been inputted, the operator 14 clicks a scan execution button E1 to perform the imaging scan IS2. After the scan execution button E1 has been clicked, the processing flow proceeds to Step S9.

At Step S9, the central processing unit 10 determines whether it is necessary to correct image data obtained by the imaging scan IS2 by calibration data indicative of a sensitivity distribution of each coil element. When it is determined that there is no need to correct it by the calibration data, the processing flow proceeds to Step S6, where the imaging scan IS2 is executed. On the other hand, when it is determined by the central processing unit 10 that there is a need to correct it by the calibration data, the processing flow proceeds to Step S10.

In the first embodiment, the imaging scan IS2 corresponds to the scan using the parallel imaging technique for receiving each magnetic resonance signal using the combination Set10 of the coil elements (refer to button D1 of FIG. 12). Accordingly, the image data acquired by the imaging scan IS2 needs to be corrected by calibration data indicative of respective sensitivity distributions of the eight coil elements 4a through 4h (refer to FIG. 5B) contained in the combination Set10 of the coil elements. Therefore, the central processing unit 10 determines that the image data obtained by the imaging scan IS2 needs to be corrected by the calibration data, and the processing flow proceeds to Step S10.

At Step S10, it is determined whether the already-acquired calibration data CAL1 (refer to FIG. 11) is of calibration data usable to correct the image data obtained by the imaging scan IS2. In order to carry out this determination, the scan condition for the calibration scan Sca11 and the scan condition for the imaging scan IS2 are compared with each other.

Figure 13:
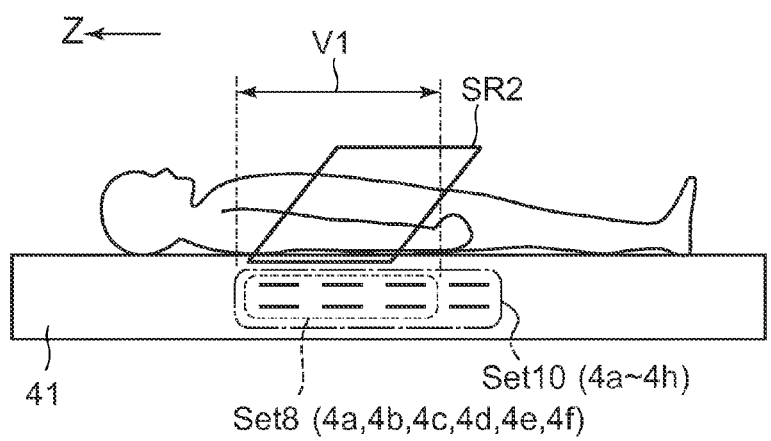
FIG. 13 is a diagram in which a scan condition at the calibration scan Sca11 and a scan condition at the imaging scan IS2 are compared with each other.

FIG. 13 is a diagram in which the scan condition for the calibration scan Sca11 and the scan condition for the imaging scan IS2 are compared with each other.

At Step S10, the scan condition for the calibration scan Sca11 and the scan condition for the imaging scan IS2 are compared with each other. It is determined whether the result of comparison satisfies the following conditions.

(Condition 1) The combination of the coil elements used when the calibration scan Sca11 is executed is the same as the combination of the coil elements used when the imaging scan IS2 is executed.

(Condition 2) The orientation and posture of the subject 13 at the time that the calibration scan Sca11 is executed, and the orientation and posture of the subject 13 at the time that the imaging scan IS2 is executed, are the same.

(Condition 3) The scan range of the subject 13 at the time that the calibration scan Sca11 is executed includes the scan range of the subject 13 at the time that the imaging scan IS2 is executed.

When any one of the above conditions is not satisfied, the image data acquired by the imaging scan IS2 cannot be corrected by the calibration data CAL1 acquired by the calibration scan Sca11. It is understood that referring to FIG. 13, "the condition 2" is satisfied but "the condition 1" and "the condition 3" are not satisfied. It is thus determined that the calibration data CAL1 acquired by the calibration scan Sca11 cannot be used for the correction of the image data acquired by the imaging scan IS2. The processing flow is returned to Step S4.

At Step S4, a scan condition for a calibration scan Sca12 executed to acquire calibration data suitable for the imaging scan IS2 is determined Described concretely, a combination of coil elements for receiving magnetic resonance signals generated by execution of the calibration scan Sca12 and a scan range taken when the calibration scan Sca12 is performed are determined A description will be made below of how the combination of the coil elements and the scan range are determined.

(1) As to a method for determining the combination of the coil elements at the calibration scan Sca12:

The combination of the coil elements used in the calibration scan Sca12 should be identical to that of the coil elements used in the imaging scan IS2. At the imaging scan IS2, the combination Set10 of the coil elements is used (refer to button D1 of FIG. 12). Accordingly, the central processing unit 10 determines that the magnetic resonance signals are received using the combination Set10 of the coil elements at the calibration scan Sca12.

(2) As to a method for determining the scan range taken when the calibration scan Sca12 is performed:

The scan range for the calibration scan Sca12 needs to include the entire scan range SR2 (refer to the positioning image IM of FIG. 12) at the imaging scan IS2, which has been set by the operator 14. Thus, the scan range for the calibration scan Sca12 is set so as to include the entire scan range SR2 at the imaging scan IS2, which has been set by the operator 14 (refer to FIG. 14).

Figure 14:
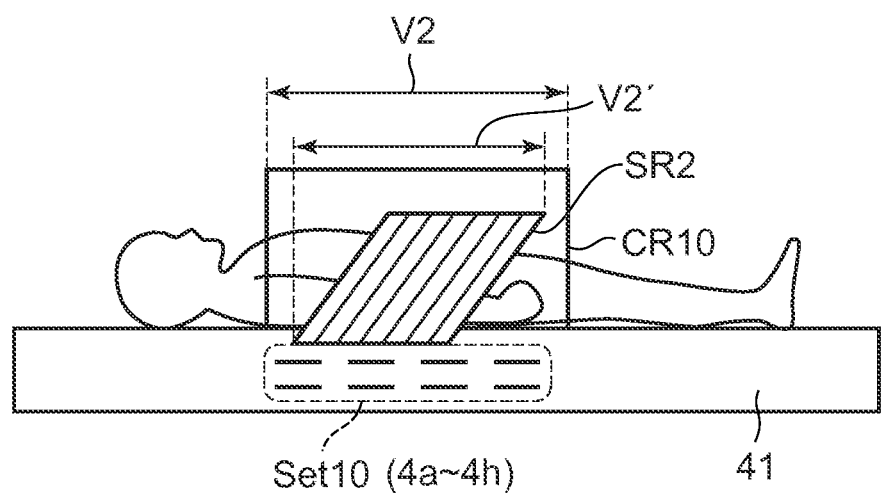
FIG. 14 is a diagram illustrating a scan range for a calibration scan Sca12.

FIG. 14 is a diagram showing the scan range for the calibration scan Sca12.

In FIG. 14, two scan ranges V2 and V2' are respectively shown as the scan range for the calibration scan Sca12. The scan range V2' is set so as to include only the scan range SR2 for the imaging scan IS2. On the other hand, the scan range V2 is set so as to include both of the scan range SR2 for the imaging scan IS2 and the sensitive region CR10 of the combination Set10 of the coil elements. Since the scan range for the calibration scan Sca12 may include the entire scan range SR2 for the imaging scan IS2, either of the scan ranges V2 and V2' may be set as the scan range for the calibration scan Sca12. In the first embodiment, the description of the scan range V2 will be continued assuming that the scan range V2 is adopted as the scan range for the calibration scan Sca12.

The combination Set10 of the coil elements at the calibration scan Sca12, and the scan range V2 are determined. Other scan conditions are also determined as needed. Thereafter, the processing flow proceeds to Step S5.

At Step S5, the calibration scan Sca12 is performed in accordance with the scan condition determined at Step S4. At the calibration scan Sca12, the scan range V2 (refer to FIG. 14) is scanned. Magnetic resonance signals from the scan range V2 are received by the combination Set10 of the coil elements. The central processing unit 10 calculates calibration data CAL2 indicative of respective sensitivity distributions of the eight coil elements 4a through 4h (refer to FIG. 14) configuring the combination Set10 of the coil elements, based on the received magnetic resonance signals. The calibration data CAL2 is stored in association with the following information (1) through (3):

(1) Combination Set10 of coil elements used in calibration scan Sca12, (2) Orientation and posture of subject at calibration scan Sca12 (pattern (a)), and (3) Scan range V2 at calibration scan Sca12.

Figure 15:
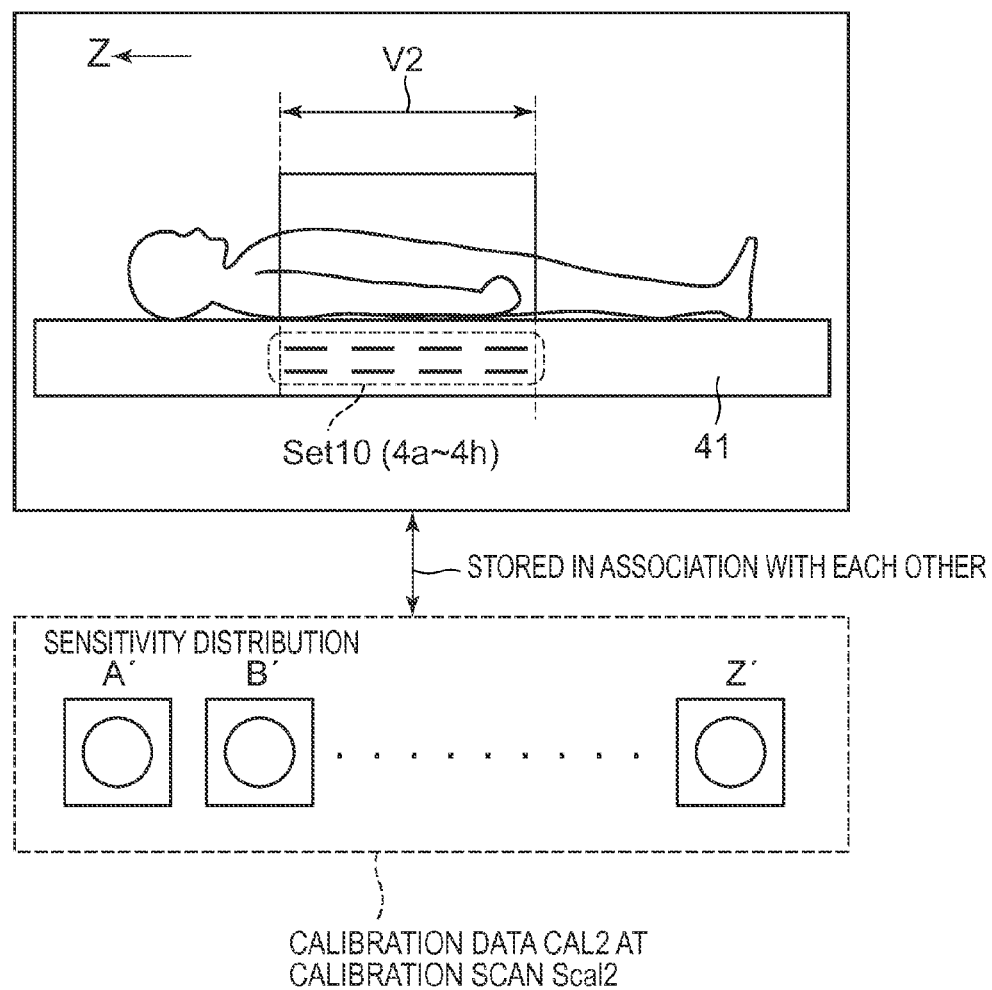
FIG. 15 is a diagram schematically showing the manner in which calibration data CAL2 and information (1) through (3) are associated with one another.

FIG. 15 schematically shows the manner in which the calibration data CAL2 and the above information (1) through (3) are associated with each other. After the calibration data CAL2 has been stored in association with the above information (1) through (3), the processing flow proceeds to Step S6.

At Step S6, the imaging scan IS2 is performed. At the imaging scan IS2, the corresponding magnetic resonance signals of the slices K1' through Kn' are received using the combination Set10 of the coil elements in accordance with the condition set by the operator 14. Thereafter, image data is generated based on the received magnetic resonance signals, and the generated image data is corrected using the calibration data CAL2 (refer to FIG. 15) determined at Step S5. It is thus possible to acquire a high-quality MR image. After the execution of the imaging scan IS2, the processing flow proceeds to Step S7.

At Step S7, it is determined whether all imaging scans are executed. In the first embodiment, there is a need to execute the three imaging scans IS1 through IS3 (refer to FIG. 8). The imaging scans IS1 and IS2 have been executed, but the imaging scan IS3 has not yet been executed. Accordingly, the processing flow proceeds to Step S8.

At Step S8, the operator 14 develops a scan plan at the imaging scan IS3.

Figure 16:
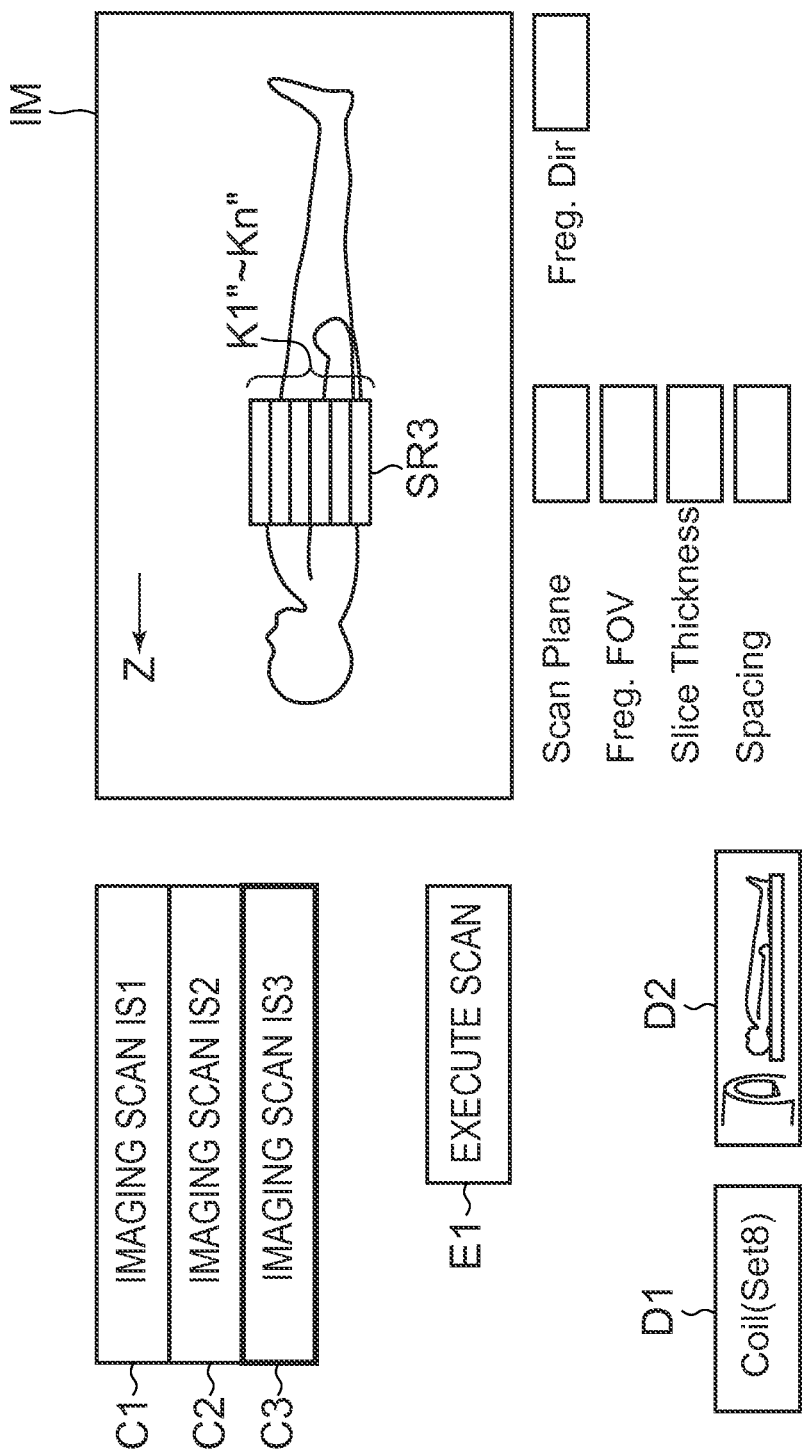
FIG. 16 is a diagram illustrating one example of a display screen when a scan plan at an imaging scan IS3 is developed.

FIG. 16 is a diagram showing one example of a display screen when the scan plan at the imaging scan IS13 is developed.

The operator 14 operates the input device 11 (refer to FIG. 1) while referring to the positioning image IM and thereby inputs slices to the positioning image IM. The manner in which slices K1" through Kn" are inputted to the positioning image IM is shown in FIG. 16. In the first embodiment, the slices K1" through Kn" are coronal sections but may be other sections. A range surrounded by the slices K1" through Kn" becomes a scan range SR3 at the imaging scan IS3.

After the slices K1" through Kn" have been set, the operator 14 selects the corresponding combination of coil elements suited to receiving magnetic resonance signals of the slices K1" through Kn" out of the coil elements 4a through 4h (refer to FIG. 1). In the first embodiment, as shown in FIGS. 3A-3D, 4A-4D, 5A and 5B, and 6-8, the combinations of the selectable coil elements have been determined in advance (combinations Set1 through Set10 of coil elements). Thus, the operator 14 selects the corresponding combination of coil elements suited to receiving the magnetic resonance signals of the slices K1" through Kn" out of the combinations Set1 through Set10 of the coil elements. Now, assume that when the imaging scan IS3 is executed, the operator 14 has judged that the combination Set8 of the coil elements is most suitable within the combinations Set1 through Set10. Thus, the operator 14 clicks a coil element selection button D1 and thereby selects the combination Set8 of the coil elements out of the combinations Set1 through Set10.

The operator 14 operates an orientation/posture set button D2 to input the orientation and posture of the subject 13 when the subject 13 is placed on the cradle. In the first embodiment, since the orientation and posture of the subject 13 are given as the pattern (a), the operator 14 causes the orientation/posture set button D2 to display the orientation and posture of the subject 13 corresponding to the pattern (a). It is thus possible to input the orientation and posture of the subject 13 when the subject 13 is placed on the cradle.

Further, the operator 14 also sets other scan conditions such as a slice thickness, etc. as needed. It is thus possible to input the scan condition for the imaging scan IS3.

After the scan condition for the imaging scan IS3 has been inputted, the operator 14 clicks a scan execution button E1 to perform the imaging scan IS3. After the scan execution button E1 has been clicked, the processing flow proceeds to Step S9.

At Step S9, the central processing unit 10 determines whether it is necessary to correct image data obtained by the imaging scan IS3 by calibration data indicative of a sensitivity distribution of each coil element. In the first embodiment, the imaging scan IS3 is a scan using a parallel imaging technique for receiving each magnetic resonance signal using the combination Set8 of the coil elements (refer to button D1 of FIG. 16). Thus, the image data obtained by the imaging scan IS3 needs to be corrected by the corresponding calibration data indicative of the respective sensitivity distributions of the six coil elements 4a through 4f (refer to FIG. 4D) contained in the combination Set8. Therefore, the central processing unit 10 determines that it is necessary to correct the image data acquired by the imaging scan IS3 by the calibration data, and the processing flow proceeds to Step S10.

At Step S10, it is determined whether the already-acquired calibration data CAL1 and CAL2 (refer to FIGS. 11 and 15) are respectively of calibration data usable to correct the image data obtained by the imaging scan IS3. In order to perform this determination, the scan conditions for the calibration scans Sca11 and Sca12, and the scan condition for the imaging scan IS3 are compared with each other.

Figure 17:
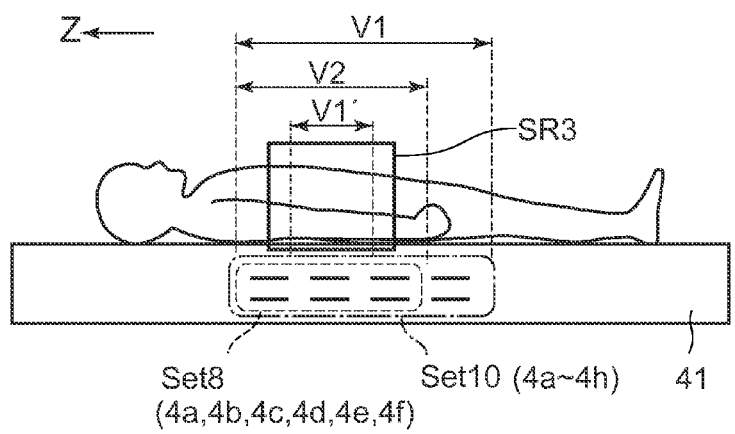
FIG. 17 is a diagram in which scan conditions at calibration scans Sca11 and Sca12 and a scan condition at an imaging scan IS3 are compared with each other.

FIG. 17 is a diagram in which the scan conditions for the calibration scans Sca11 and Sca12 and the scan condition for the imaging scan IS3 are compared with each other.

At Step S10, the scan conditions for the calibration scans Sca11 and Sca12 and the scan condition for the imaging scan IS3 are compared with each other. It is determined whether the result of comparison satisfies the following conditions.

(Condition 1) The combination of the coil elements used when the calibration scan Sca11 or Sca12 is executed is the same as the combination of the coil elements used when the imaging scan IS3 is executed.

(Condition 2) The orientation and posture of the subject 13 at the time that the calibration scan Sca11 or Sca12 is executed, and the orientation and posture of the subject 13 at the time that the imaging scan IS3 is executed, are the same.

(Condition 3) The scan range of the subject 13 at the time that the calibration scan Sca11 or Sca12 is executed includes the scan range of the subject 13 at the time that the imaging scan IS3 is executed.

Referring to FIG. 17, "the condition 2" and "the condition 3" are satisfied but "the condition 1" is not satisfied in the case of the scan condition for the calibration scan Sca12. In the scan condition for the calibration scan Sca11, however, all of the three "condition 1" through "condition 3" are satisfied. It is thus judged that the calibration data CAL1 acquired by the calibration scan Sca11 can be used for the correction of the image data acquired by the imaging scan IS3. The processing flow is returned to Step S6.

At Step S6, the imaging scan IS3 is performed. At the imaging scan IS3, the magnetic resonance signals of the slices K1" through Kn" are received using the combination Set8 of the coil elements in accordance with the condition set by the operator 14. Thereafter, image data is generated based on the received magnetic resonance signals, and the generated image data is corrected using the calibration data CAL1 (refer to FIG. 11). It is thus possible to obtain a high-quality MR image. After the imaging scan IS3 has been executed, the processing flow proceeds to Step S7.

It is determined at Step S7 whether all the imaging scans are executed. In the first embodiment, it is necessary to perform the three imaging scans IS1 through IS3 (refer to FIG. 8). The three imaging scans have already been performed. Accordingly, the processing flow is terminated.

In the first embodiment as mentioned above, since the scan condition for each calibration scan is automatically set, the operator 14 needs not to set the scan condition for the calibration scan manually, and the burden on the operator 14 is hence lightened.

Incidentally, in the first embodiment, the scan range V1 has been adopted as the scan range for the calibration scan Sca11 without using the scan range V1' (refer to FIG. 10). The scan range V1' may however be adopted instead of the scan range V1. The scan range V1' is also shown in FIG. 17 in addition to the scan range V1. The scan range V1', however, becomes narrower than the scan range SR3 at the imaging scan IS3 as shown in FIG. 17. Thus, when the scan range V1' is adopted instead of the scan range V1, the "condition 3" of the above three conditions "condition 1" through "condition 3" is not satisfied. In this case, it is determined at Step S10 that the usable calibration data does not exist. Therefore, the processing flow is returned to Steps S4 and S5, where it is necessary to perform the calibration scan again, so that the imaging time becomes longer. On the other hand, since the above "condition 3" is satisfied if the scan range V1 is adopted, the execution of the calibration scan becomes unnecessary, thus making it possible to shorten the imaging time. Accordingly, the scan range V1 that covers a range wider than the scan range V1' is preferably adopted as the scan range for the calibration scan Sca11. Due to the similar reason, the scan range V2 that covers a range wider than the scan range V2' is preferably adopted even as for the scan range for the calibration scan Sca12.

Incidentally, in the first embodiment, although the imaging scans IS1 through IS3 are respectively taken as the imaging method using the parallel imaging technique, they do not necessarily have to be the imaging method using the parallel imaging technique. For example, an imaging method using a PURE (Phased array UnifoRmity Enhancement) technique may be adopted. When the PURE technique is used, magnetic resonance signals may be received from the subject upon a calibration scan using the RF coil 24 (refer to FIG. 1) built in the magnetic field generator 2 as well as the coil elements embedded in the cradle 4 to thereby generate calibration data.

(2) Second Embodiment

The first embodiment has explained the example using the coil device 41 installed to the predetermined position with respect to the cradle 4. A second embodiment will explain an example using a floating coil installable to an arbitrary position with respect to the cradle.

The second embodiment is equipped with the floating coil 20 capable of being mounted to the arbitrary position with respect to the cradle.

Figure 18:
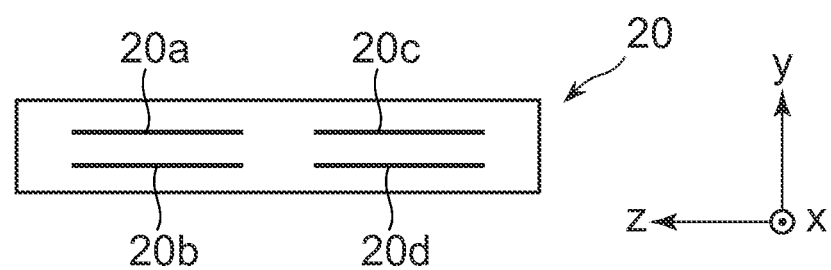
FIG. 18 is a diagram illustrating a floating coil 20 employed in a second embodiment.

FIG. 18 is a diagram showing the floating coil 20 employed in the second embodiment.

The floating coil 20 has four coil elements 20a through 20d. The four coil elements 20a through 20d are of, for example, loop coil elements, figure-of-eight coil elements or the like.

In the second embodiment, when magnetic resonance signals are received from a subject 13, a combination of coil elements suited to receiving magnetic resonance signals in a scan range of the subject 13 is selected out of the four coil elements 20a through 20d of the floating coil 20. However, the combinations of the coil elements selectable out of the four coil elements 20a through 20d have been determined in advance. The combinations of the selectable coil elements will be explained below.

FIG. 19 is a diagram for explaining the combinations of the selectable coil elements.

In the second embodiment, three combinations Set21 through Set23 are prepared as the combinations of the selectable coil elements. The combination Set21 includes the two coil elements 20a and 20b, and the combination Set22 includes the two coil elements 20c and 20d. The combination Set23 includes the four coil elements 20a through 20d.

A description will next be made of sensitive regions of the combinations Set21, Set22 and Set23.

Figure 20A:
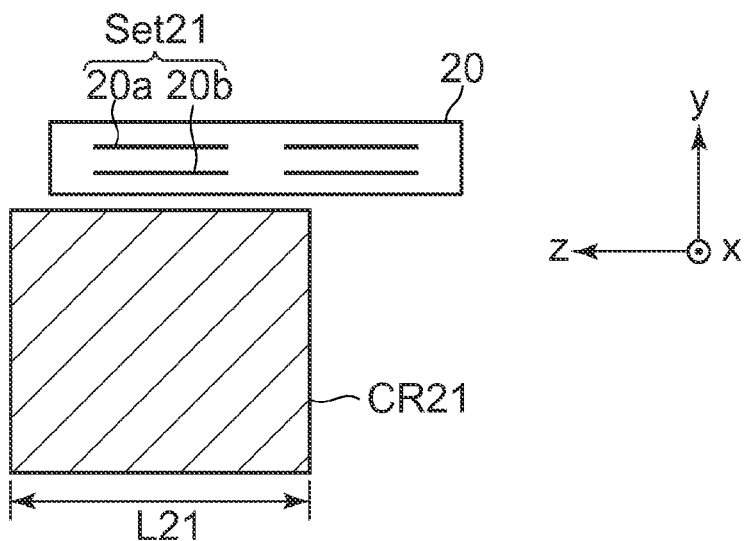
FIG. 20A through FIG. 20C are diagrams for explaining sensitive regions of the combinations Set21, Set22 and Set23 of the coil elements.
Figure 20B:
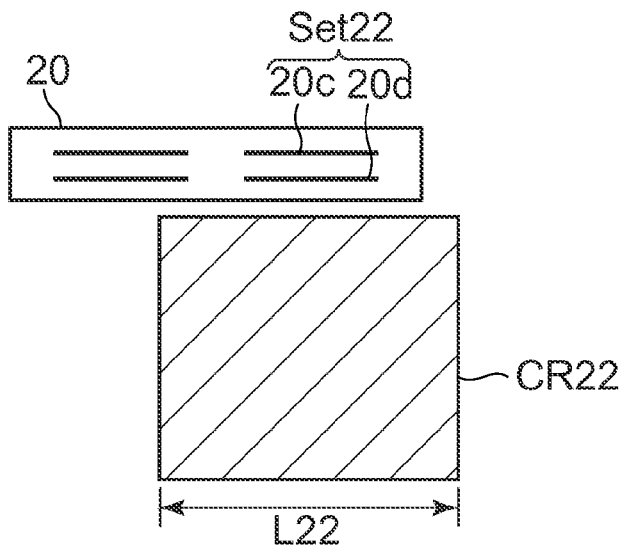
Figure 20C:
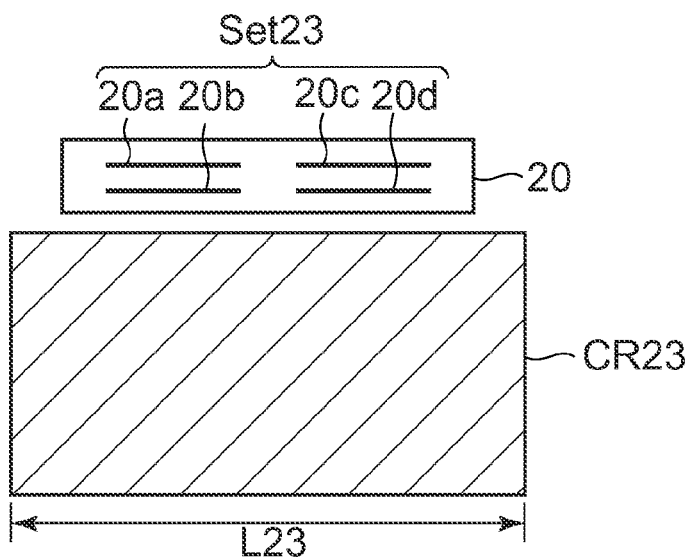

FIGS. 20A through 20C are diagrams for describing the sensitive regions of the combinations Set21, Set22 and Set23.

FIGS. 20A, 20B, and 20C respectively show the sensitive regions CR21, CR22 and CR23 of the combinations Set21, Set22 and Set23.

Since the floating coil 20 is installed to the arbitrary position with respect to the cradle 4, it is different from the coil device employed in the first embodiment. It is not possible to store information about the positions of the sensitive regions CR21, CR22 and CR23. In the second embodiment, however, z-direction lengths L21, L22 and L23 of the sensitive regions CR21, CR22 and CR23 have been stored.

A procedure for imaging a subject in the second embodiment will be explained below referring to FIGS. 21 and 22.

Figure 21:
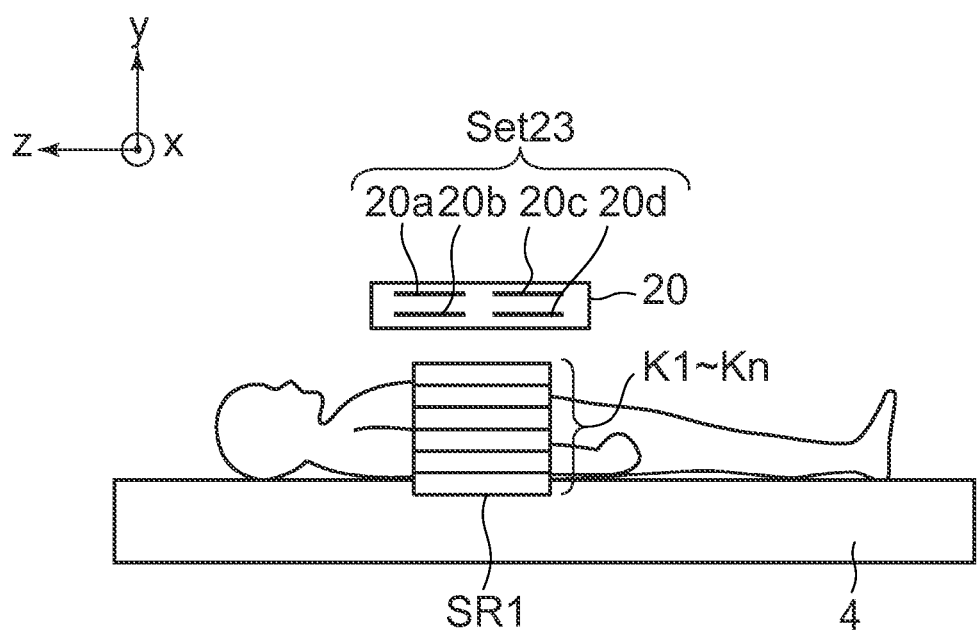
FIG. 21 is a diagram showing a relationship in position between the floating coil 20 and slices K1 through Kn where imaging scans are executed.

The operator 14 first mounts the floating coil 20 onto the subject and sets slices K1 through Kn taken where an imaging scan is executed (refer to FIG. 21).

FIG. 21 is a diagram showing a relationship in position between the floating coil 20 and the slices K1 through Kn where the imaging scan is executed.

A range surrounded by the slices K1 through Kn becomes a scan range SR1 at the imaging scan. The operator 14 selects the corresponding combination of coil elements for receiving magnetic resonance signals of the slices K1 through Kn out of the combinations Set21 through Set23 of the coil elements. In the second embodiment, the combination Set23 of the coil elements is assumed to have been selected.

Figure 22:
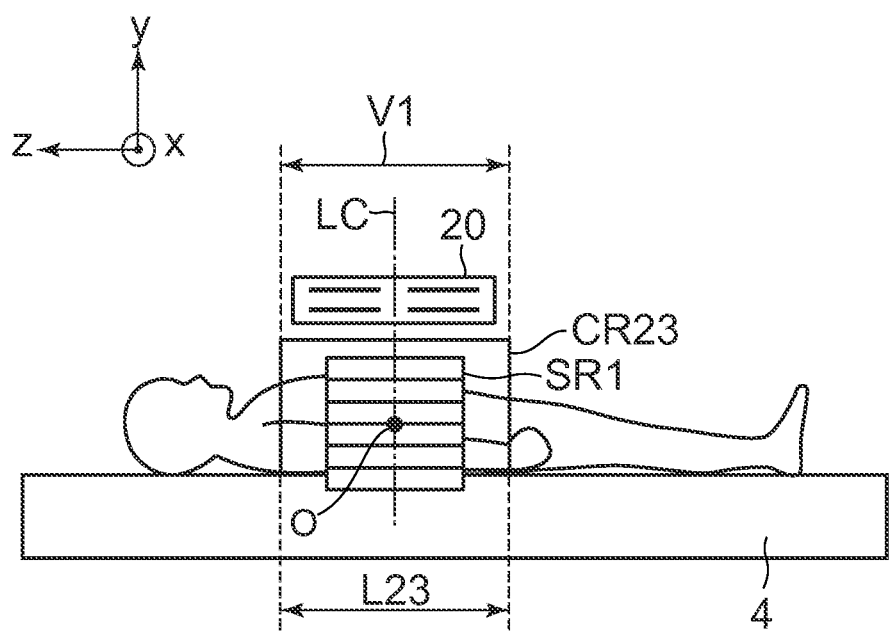
FIG. 22 is a diagram illustrating a center line LC of a scan range SR1.

The central processing unit 10 determines the center line of the scan range SR1 surrounded by the slices K1 through Kn (refer to FIG. 22).

FIG. 22 is a diagram showing the center line LC of the scan range SR1.

The center line LC of the scan range SR1 is of a straight line that passes through the center point O of the scan range SR1 and extends in a y direction. In the second embodiment, the sensitive region CR23 is positioned in such a manner that the z-direction length L23 of the sensitive region CR23 is divided into two equal parts by the center line LC of the scan range SR1. It is thus possible to determine the position of the sensitive region CR23. After the sensitive region CR23 has been positioned, a scan range V1 for a calibration scan is determined so as to include both of the scan range SR1 and the sensitive region CR23.

Even where the floating coil 20 installable to the arbitrary position with respect to the cradle 4 is used as described above, the scan range V1 for the calibration scan can be determined After the scan range V1 for the calibration scan has been determined, the calibration scan is executed, followed by execution of the imaging scan, whereby imaging is brought to completion.

Since the z-direction lengths L21, L22 and L23 of the sensitive regions CR21, CR22 and CR23 have been stored as described above in the second embodiment, each of the sensitive regions CR21, CR22 and CR23 can be positioned. It is thus possible to decide the scan range for the calibration scan.

Incidentally, in the second embodiment, the z-direction length L23 of the sensitive region CR23 is divided into the two equal parts by the center line LC of the scan range SR1. However, another line different from the center line LC is defined in the scan range SR1, and the z-direction length L23 of the sensitive region CR23 may be defined so as to be divided into two equal parts by another line defined in the scan range SR1.

The z-direction length L23 of the sensitive region CR23 is not necessarily required to be divided into the two equal parts by the center line LC of the scan range SR1. It is also possible to divide the z-direction length L23 of the sensitive region CR23 in, for example, a ratio of 1:2 at the center line LC of the scan range SR1.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging apparatus configured to execute a calibration scan for acquiring calibration data used to correct image data of a subject, to execute a first imaging scan using a first scan range for acquiring the image data of the subject, and to receive magnetic resonance signals using combinations of coil elements selected out of a plurality of coil elements, said magnetic resonance imaging apparatus comprising:
  a calibration scan condition determining device configured to:
    determine a second scan range for use in the calibration scan, based on a wherein the second scan range includes the first scan range; and
    determine a first combination of coil elements used to receive magnetic resonance signals in the first scan range as a combination of coil elements used in the calibration scan, wherein during the calibration scan, magnetic resonance signals in the second scan range are received using the first combination of coil elements; and
  a calibration data calculation device configured to calculate the calibration data based on the magnetic resonance signals received in the second scan range,
  wherein said calibration scan condition determining device is further configured to determine whether the following conditions will be satisfied when a second imaging scan is executed:
    (1) the first combination of the coil elements used when the calibration scan is executed is identical to a second combination of coil elements used when the second imaging scan is executed,
    (2) an orientation and a posture of the subject taken when the calibration scan is executed is the same as an orientation and a posture of the subject taken when the second imaging scan is executed, and
    (3) the second scan range taken when the calibration scan is executed includes a third scan range taken when the second imaging scan is executed,
  wherein when said calibration scan condition determining device determines that all of the conditions (1) through (3) are satisfied, the second imaging scan is executed and a second set of image data acquired by the second imaging scan is corrected using the calibration data calculated by said calibration data calculation device.

2. The magnetic resonance imaging apparatus according to claim 1, wherein the second scan range includes the first scan range and a sensitive region of the first combination of coil elements.

3. The magnetic resonance imaging apparatus according to claim 2, further comprising a storage device configured to store position information about the sensitive region of the first combination of coil elements.

4. The magnetic resonance imaging apparatus according to claim 3, wherein the calibration data is a sensitive region of the plurality of coil elements.

5. The magnetic resonance imaging apparatus according to claim 2, wherein said calibration scan condition determining device is configured to locate the sensitive region such that a center line of the first scan range taken when the first imaging scan is executed, divides a length extending in a predetermined direction, of the sensitive region of the first combination of coil elements into two equal parts.

6. The magnetic resonance imaging apparatus according to claim 5, further comprising a storage device configured to store the length extending in the predetermined direction, of the sensitive region of the first combination of coil elements.

7. The magnetic resonance imaging apparatus according to claim 2, wherein the calibration data is a sensitive region of the plurality of coil elements.

8. The magnetic resonance imaging apparatus according to claim 1, wherein when said calibration scan condition determining device determines that at least any one of the conditions (1) through (3) is not satisfied, a second calibration scan is executed for acquiring a second set of calibration data used to correct the second set of image data, wherein the second calibration scan is executed before the second imaging scan is executed.

9. The magnetic resonance imaging apparatus according to claim 8, wherein said calibration scan condition determining device is configured to determine a fourth scan range including the third scan range as a scan range for the second calibration scan, and to determine the second combination of the coil elements as a combination of coil elements used in the second calibration scan.

10. The magnetic resonance imaging apparatus according to claim 1, wherein the calibration data is a sensitive region of the plurality of coil elements.

11. The magnetic resonance imaging apparatus according to claim 1, further comprising a magnetic field generator comprising a radio frequency (RF) coil configured to receive the magnetic resonance signals of the subject, wherein during the calibration scan, magnetic resonance signals in the second scan range are received using the first combination of coil elements and said RF coil.

12. The magnetic resonance imaging apparatus according to claim 11, wherein the calibration data calculation device is configured to calculate the calibration data based on the magnetic resonance signals in the second scan range received using the first combination of coil elements and said RF coil.

* * * * *